(12) United States Patent
Ogura

(10) Patent No.: US 9,594,314 B2
(45) Date of Patent: Mar. 14, 2017

(54) EXPOSURE APPARATUS, ALIGNMENT METHOD, AND DEVICE MANUFACTURING METHOD

(71) Applicant: CANON KABUSHIKI KAISHA, Tokyo (JP)

(72) Inventor: Takashi Ogura, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/713,060

(22) Filed: May 15, 2015

(65) Prior Publication Data

US 2015/0331329 A1    Nov. 19, 2015

(30) Foreign Application Priority Data

May 19, 2014   (JP) ................................ 2014-103097

(51) Int. Cl.
*G03F 7/20*   (2006.01)
*G03F 9/00*   (2006.01)

(52) U.S. Cl.
CPC ........ *G03F 9/7007* (2013.01); *G03F 7/70141* (2013.01)

(58) Field of Classification Search
CPC .............................. G03F 9/7007; G03F 9/7011
See application file for complete search history.

(56) References Cited

U.S. PATENT DOCUMENTS

| 6,225,012 B1* | 5/2001 | Nishi .................. G03F 7/70691 430/22 |
| 2004/0189995 A1* | 9/2004 | Tanaka .................. G03F 9/7003 356/401 |
| 2005/0095116 A1* | 5/2005 | Kitayama ............. H01L 21/682 414/737 |
| 2006/0232777 A1* | 10/2006 | Finarov ................. G03F 9/7088 356/401 |

FOREIGN PATENT DOCUMENTS

| JP | 0530304 B2 | 5/1993 |
| JP | 2005167002 A | 6/2005 |

* cited by examiner

*Primary Examiner* — Steven H Whitesell Gordon
(74) *Attorney, Agent, or Firm* — Rossi, Kimms & McDowell LLP

(57) ABSTRACT

The exposure apparatus includes a first detector, a first alignment unit, a second detector, and a second alignment unit, and a controller, wherein the controller controls the second alignment unit so that alignment of a substrate is conducted based on a detection result from detection of the mark by the second detector in a first view when alignment of the substrate can be conducted by the first alignment unit at a prescribed alignment accuracy, and controls the second alignment unit so that alignment of the substrate is conducted based on a detection result from detection of the mark by the second detector in a second view that is wider than the first view when alignment of the substrate cannot be conducted by the first alignment unit at the prescribed alignment accuracy.

9 Claims, 5 Drawing Sheets

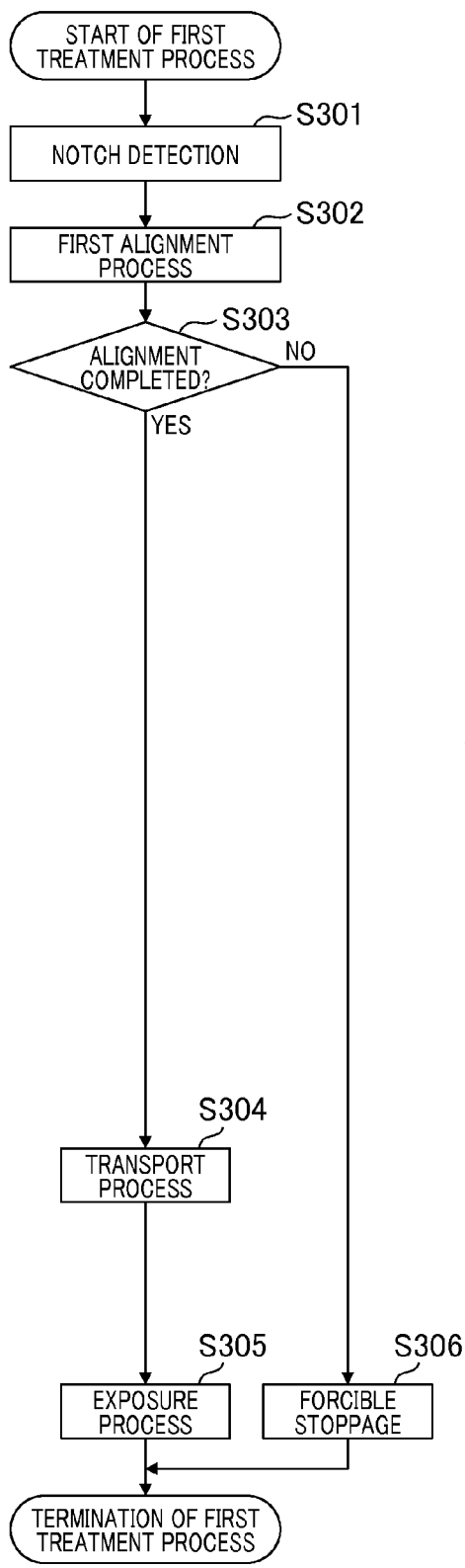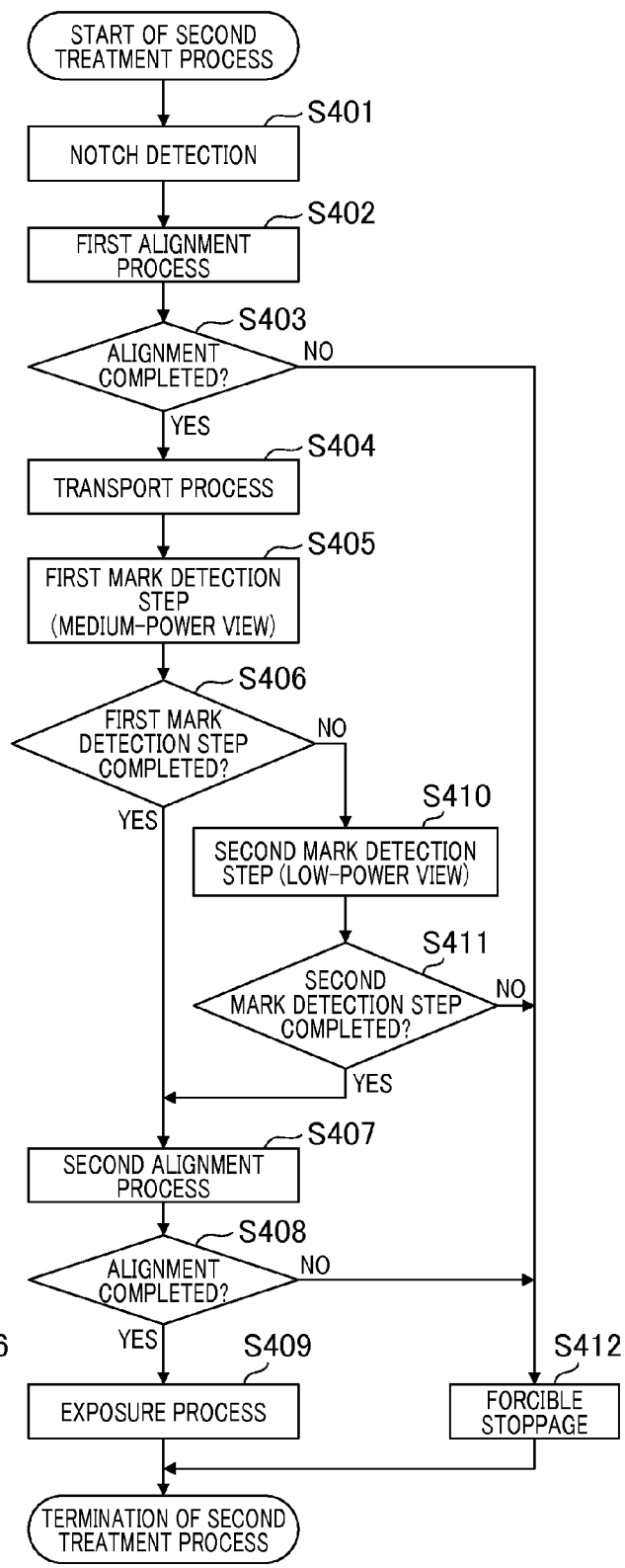

EXPOSURE APPARATUS, ALIGNMENT METHOD, AND DEVICE MANUFACTURING METHOD

BACKGROUND OF THE INVENTION

Field of the Invention

The present invention relates to an exposure apparatus, an alignment method, and a device manufacturing method.

Description of the Related Art

An exposure apparatus is a device which exposes a substrate (a wafer or the like on the surface of which a resist layer is formed) via the pattern of an original plate (a reticle or the like) in a lithography process included in a manufacturing process of semiconductor devices or liquid crystal display devices or the like. With this type of exposure apparatus, prior to actual exposure, so-called alignment is conducted wherein an irradiation region of a pattern image and a predetermined exposure region on a substrate are aligned. As an alignment method, there is a method which sequentially conducts a first alignment process that is called, for example, mechanical pre-alignment, and a second alignment process that is called, for example, TV pre-alignment, and that has a higher degree of accuracy than the first alignment process. As a specific instance enabling application of the first alignment process of these, Japanese Examined Patent Application No. 05-030304 discloses a method wherein a shape of a notched area existing at the outer periphery of a substrate is detected using multiple linear image sensors, and alignment is conducted so that the detection result falls within a prescribed range. On the other hand, as a specific instance enabling application of the second alignment process, Japanese Unexamined Patent Application No. 2005-167002 discloses a method wherein alignment is conducted by detecting a mark that has been pre-exposed on a substrate. Japanese Unexamined Patent Application No. 2005-167002 also describes countermeasures for the case where the mark cannot be detected.

Particularly with respect to the first alignment process, with the method disclosed in Japanese Unexamined Patent Application No. 2005-167002, it may happen that alignment cannot be conducted when foreign matter (dust, protrusion of the resist, etc.) or chipping exists at a position detected by a linear image sensor, because the detection result does not fall within the prescribed range. In such cases, the productivity of the exposure apparatus is reduced, because a set of processes is temporarily suspended in the first alignment process.

SUMMARY OF THE INVENTION

The present invention, for example, provides an exposure apparatus that is advantageous in terms of productivity.

The present invention is an exposure apparatus which exposes a pattern on a substrate, and includes: a first detector which detects a shape of a substrate, a first alignment unit which aligns a substrate based upon a detection result of the first detector, a second detector which detects a mark that is formed on the substrate that was aligned by the first alignment unit, a second alignment unit which aligns the substrate that was aligned by the first alignment unit based on a detection result of the second detector, and a controller, wherein the controller controls the second alignment unit so that alignment of the substrate is conducted based upon a detection result from detection of the mark by the second detector in a first view when the first alignment unit is able to conduct alignment of the substrate at a prescribed alignment accuracy, and controls the second alignment unit so that alignment of the substrate is conducted based upon a detection result from detection of the mark by the second detector in a second view that is wider than the first view when the first alignment unit is unable to align the substrate at the prescribed alignment accuracy due to adhesion of foreign matter to the substrate.

Further features of the present invention will become apparent from the following description of exemplary embodiments with reference to the attached drawings.

BRIEF DESCRIPTION OF THE DRAWINGS

FIG. 4A is a flowchart which shows a conventional first treatment process.

FIG. 4B is a flowchart which shows a conventional second treatment process.

DESCRIPTION OF THE EMBODIMENTS

The present invention is described below with reference to drawings and the like pertaining to embodiments.

(First Embodiment)

Figure 1:
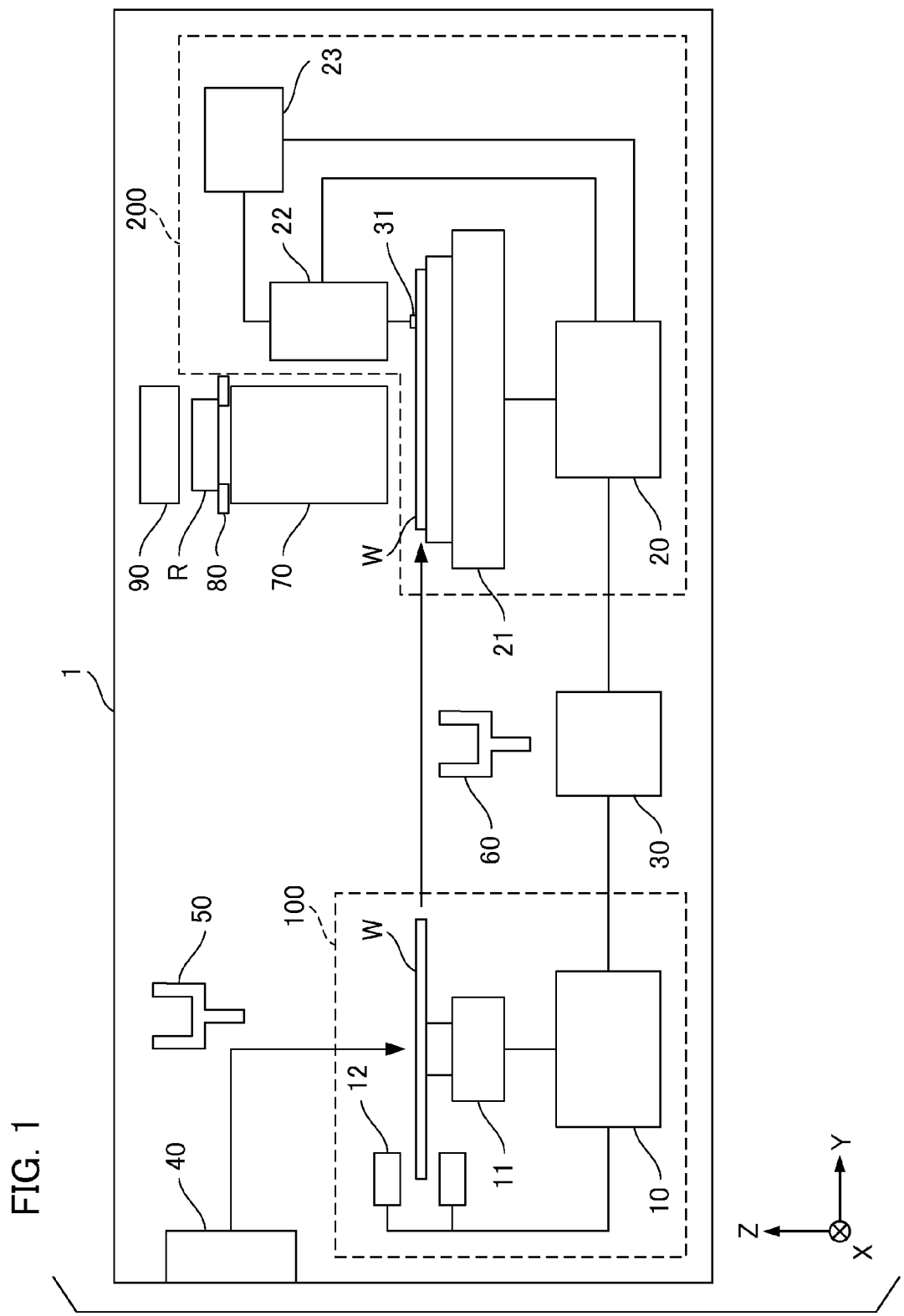
FIG. 1 is a drawing which shows a configuration of an exposure apparatus of a first embodiment of the present invention.

First, a description is given of a configuration of an exposure apparatus of a first embodiment of the present invention. FIG. 1 is a schematic view which shows a configuration of an exposure apparatus 1 of the present embodiment. The exposure apparatus 1 is, for example, used in a lithography process in a manufacturing process of a semiconductor device, and can be used as a projection-type exposure apparatus that exposes (transfers) an image of a pattern formed on a reticle R onto a wafer W (onto a substrate) by the step-and-repeat method. In FIG. 1, the Z axis runs parallel to an optical axis of a projection optical system 70 that is described below, the Y axis runs in a scanning direction of the reticle R and the wafer W during exposure in a plane that is perpendicular to the Z axis, and the X axis runs in a non-scanning direction that is orthogonal to the Y axis.

The exposure apparatus 1 is, first, provided with a wafer stage 21, a projection optical system 70, a reticle stage 80, and an illumination system 90. The illumination system 90 illuminates the reticle R by adjusting light that is projected from a light source (laser light source) that is not illustrated in the drawings. The reticle R is, for example, an original plate of vitreous silica on which a pattern is formed (e.g., a circuit pattern) that is to be transferred to the wafer W. The reticle stage 80 holds the reticle R, and is capable of movement in the respective axial directions of X and Y. The projection optical system 70 projects light that passes through the reticle R onto the wafer W at a prescribed magnification (e.g., ½). The wafer W is a substrate composed of, for example, monocrystalline silicon, on the surface of which a resist (photosensitive agent) is applied. The wafer stage (substrate holder) 21 holds the wafer W, and is capable of movement in the respective axial directions of X, Y, Z (which may also include ωx, ωy, ωz that constitute the respective rotational directions).

The exposure apparatus 1 is provided with two types of alignment unit which are the first alignment unit 100 and the second alignment unit 200. Furthermore, the exposure apparatus 1 is provided with a first transport mechanism 50 which transports the wafer W to the first alignment unit 100 from an interface 40 such as an in-line or FOUP, and a second transport mechanism (conveyor) 60 which transports the wafer W to the second alignment unit 200 from the first alignment unit 100.

The first alignment unit 100 conducts so-called mechanical pre-alignment, which aligns a position of the wafer W with a desired position at a lower degree of accuracy than the accuracy of alignment conducted by the below-mentioned second alignment unit 200. The alignment process of the first alignment unit 100 is hereinafter referred to as the "first alignment process." The first alignment unit 100 includes a first controller 10 containing an image processor, a first drive unit 11, and a first detector 12. The first drive unit (second substrate holder) 11 is able to change an orientation of the wafer W while holding it. For example, it is able to rotate the wafer W within the XY plane. The first detector 12 is, for example, a linear image sensor, and is capable of detecting the shape of the wafer W, and particularly the shape of indentations such as notches formed in its outer peripheral region. The first controller 10 causes the first detector 12 to detect the shape of the wafer W as a first detection process, conducts image processing of the detection result, and obtains the desired position by having the first drive unit 11 appropriately change the orientation of the wafer W based on the pertinent image processing result.

The second alignment unit 200 aligns an irradiation region that is irradiated by exposure light (projection light) emitted from the projection optical system 70, and a pattern region (shot region) consisting of a predetermined exposure target (treatment target) on the wafer W. Specifically, the second alignment unit 200 conducts so-called TV prealignment in which a mark (alignment mark) 31 that is formed in advance on the wafer W is detected and aligned with a finer accuracy than the accuracy of the alignment conducted by the first alignment unit 100. The alignment process of the second alignment unit 200 is hereinafter referred to as the "second alignment process." In addition to the wafer stage 21 that serves as the second drive unit, the second alignment unit 200 includes a second controller 20, a second detector 22, and an image processor 23. The second detector 22 is, for example, an alignment scope, and is able to detect the alignment mark 31, and change a view during detection. The second controller 20 causes the second detector 22 to detect a mark 31 as a second detection process, causes the image processor 23 to conduct image processing of the detection result, and reaches a desired position by having the wafer stage 21 appropriately change the position of the wafer W based upon the pertinent image processing result. In the foregoing description, the first alignment unit 100 and the second alignment unit 200 are respectively configured to include the first detector 12 and the second detector 22, but it is also conceivable to have the respective alignment units 100 and 200 and the respective detectors 12 and 22 constitute respectively independent components.

The second detection process also includes a process 2A that detects a mark 31, and that conducts alignment with rough accuracy, and a process 2B that conducts alignment of finer accuracy with respect to the mark 31 that was detected in process 2A. Switching between process 2A and process 2B is conducted by switching the view (or magnification) of the second detector 22. Specifically, the second detector 22 conducts detection with a wide view (a low-power view or medium-power view) when conducting process 2A, and conducts detection with a narrow view (high-power view) when conducting process 2B. Of these, in process 2A, the second detector 22 first conducts detection with the medium-power view. If unable to detect the mark 31, it then conducts detection by switching to the low-power view which is a wider view than the medium-power view. This is because conducting detection first with the medium-power view enables detection with the low-power view to be omitted if the mark 31 can be detected at that time, thereby shortening the overall time of detection of the mark 31, and consequently enabling improved throughput. However, to enable detection with the medium-power view in this case, the accuracy (mechanical pre-alignment accuracy) with which the second transport mechanism 60 transports the wafer W from the first alignment unit 100, and delivers it to the second alignment unit 200 must be an accuracy that falls within the medium-power view.

Furthermore, the exposure apparatus 1 has a controller 30. The controller 30 is, for example, constituted by a computer or the like, is connected to the various components of the exposure apparatus 1 via circuitry, and is capable of controlling the operation and adjustment of the various components according to a program or the like. In particular, the controller 30 is electrically connected to the first controller 10 via a first communication circuit 120a, and to the second controller 20 via a second communication circuit 120b, and not only controls the operations of the first alignment unit 100 and the second alignment unit 200, but also receives the respective detection results. Otherwise, the controller 30 may be integrally configured (in a shared casing) with the other parts of the exposure apparatus 1, or it may be separately configured (in a separate casing) from the other parts of the exposure apparatus 1.

In the interval until the start of exposure treatment, the exposure apparatus 1 conducts the two alignment processes of the first alignment unit 100 and the second alignment unit 200 in the above-described manner. The first transport mechanism 50 transports the wafer W received from the interface 40 to the first alignment unit 100, and the first alignment unit 100 conducts the first alignment process with respect to the pertinent wafer W. Next, the second transport mechanism 60 transports the wafer W that has completed the first alignment process in the first alignment unit 100 to the wafer stage 21 that constitutes part of the second alignment unit 200. Next, the second alignment unit 200 conducts the second alignment process with respect to the pertinent wafer W. The exposure apparatus 1 then subjects the wafer W that has completed the second alignment process to exposure (the exposure process).

Next, a description is given of the treatment process of the present embodiment including the alignment processes (alignment methods) used by the respective alignment units 100 and 200. First, in order to clarify the characteristics of the treatment process of the present embodiment, a description is given of the treatment process of a conventional exposure apparatus as a comparative example. FIGS. 4A and B are flowcharts which show treatment processes (treatment sequences) of a conventional exposure apparatus. Conventionally, there exist two types of treatment process, i.e., a first treatment process corresponding to a first exposure (a first-time exposure or the like), and a second treatment process corresponding to a second exposure (a superimposed exposure or the like). FIG. 4A shows the first treatment process, and FIG. 4B shows the second treatment process. Otherwise, for ease of comparison, the same code numbers are used for components of the conventional exposure apparatus as are used for components of the exposure apparatus 1 of the present embodiment.

First, with respect to the first treatment process, the controller 30 causes the first detector 12 in the first alignment unit 100 to detect a notch that is formed in advance on the wafer W as a first detection process (step S301). Next, the controller 30 causes the first alignment process to be executed based upon the detection result of step S301 (step S302). Next, the controller 30 judges whether or not the first alignment process was normally completed in step S302 (step S303). Now, if the controller 30 judges that the first alignment process was normally completed (Yes), it subsequently causes the wafer W to be transported to the wafer stage 21 by the second transport mechanism in a transport process (step S304). The controller 30 then executes the exposure step (step S305), terminating the first treatment process. At the stage of the first treatment process, the second alignment process is not conducted, because a mark 31 does not exist on the wafer W. On the other hand, if the controller 30 judges that the first alignment process was not normally completed in step S303 (No), the exposure apparatus 1 is stopped (step S306), compelling stoppage of the first treatment process.

Figure 5A:
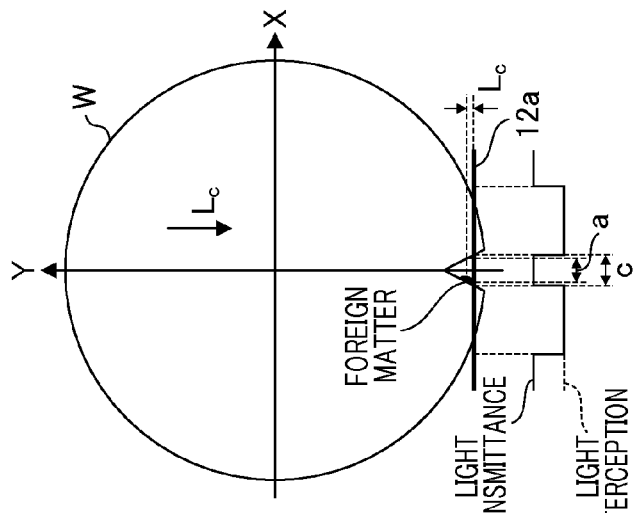
FIG. 5A is a drawing which shows a state where alignment in a Y-axis direction is normally completed in a conventional first alignment process.
Figure 5B:
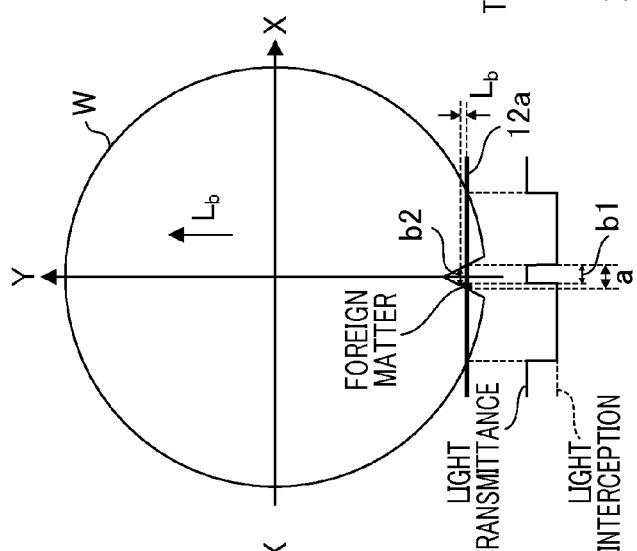
FIG. 5B is a drawing which shows a state where alignment in a Y-axis direction is not normally completed in a conventional first alignment process.
Figure 5C:
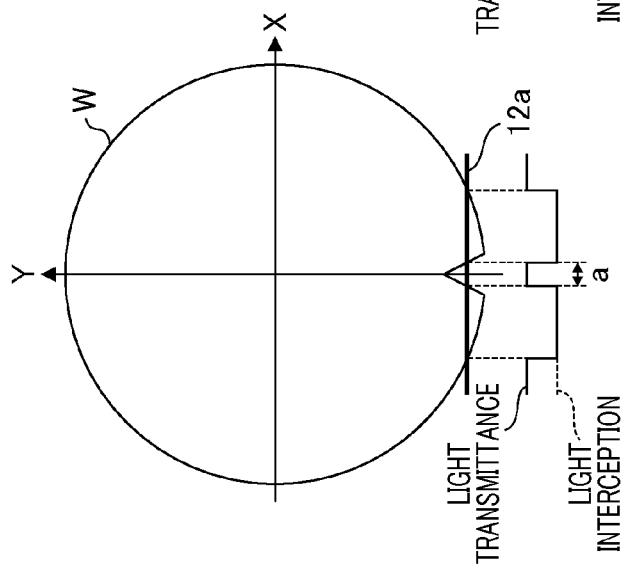
FIG. 5C is a drawing which shows a state where a detection error in a Y-axis direction is corrected in a conventional first alignment process.

Now, a description is given of circumstances where the first alignment process is not normally completed in step S303. FIGS. 5A, B, and C are plan views of the wafer W assuming the case where alignment is conducted in the Y-axis direction based on notch widths of the wafer W in the first alignment unit 100. The first detector 12 detects notch width in a detection region 12a. FIG. 5A is a drawing which shows a state where no foreign matter adheres to the notch, and alignment is normally completed in the Y-axis direction. The notch width which is the detection result at this time is considered as a. Next, FIG. 5B is a drawing which shows a state where foreign matter adheres to the notch when alignment is started in the Y-axis direction. At this time, as the notch width of the detection result is b1 (<a) due to adherence of foreign matter, the controller 30 (first controller 10) erroneously perceives that the position of a notch width b2 of the same width is detected. As a result, the controller 30 (first controller 10) calculates a deviation amount Lb that misapprehends the deviation amount in the Y-axis direction, and drives the first drive unit 11 so that the wafer W is moved toward the plus side in the Y-axis direction in order to correct the deviation amount Lb. FIG. 5C is a drawing which then shows a state following correction of the erroneous deviation amount Lb. As the original foreign matter still adheres to the notch, when detection is again conducted by the first detector 12, the notch width of the detection result is c (>a). In this connection, the controller 30 now calculates the deviation amount in the Y-axis direction as Lc, and drives the first drive unit 11 in the same way as before so that the wafer W is moved toward the minus side in the Y-axis direction in order to correct the deviation amount Lc. That is, the position after movement of the wafer W returns to the position shown in FIG. 5B. In this manner, the states shown in FIG. 5B and FIG. 5C are repeated due to the adherence of foreign matter to the notch, preventing normal detection, which corresponds to a situation where the first alignment process referred to herein is not normally completed.

Next, with respect to the second treatment process, the controller 30 causes the notch to be detected in the first alignment unit 100 as the first detection process (step S401), and executes the first alignment process based on the detection result of step S401 (step S402). Next, the controller 30 judges whether or not the first alignment process was normally completed in step S402 (step S403). Now, if it is judged that the first alignment process was normally completed (Yes), the controller 30 causes the second transport mechanism to transport the wafer W to the wafer stage 21 as the first transport process (step S404). Next, the controller 30 causes the second detector 22 to detect the mark 31 existing on the wafer W in a medium-power view (a first view or first magnification) in the second alignment unit as a first mark detection step of the second detection process (step S405). At this time, as the first alignment process of step S402 was normally completed, detection of the mark 31 was basically successful. However, for example, there may be cases where the first mark detection step is not normally completed owing to a transport error or the like occurring at the time of transport of the wafer W to the wafer stage 21, so the controller 30 subsequently judges whether or not the first mark detection step was normally completed in step S405 (step S406). Now, in the case where it is judged that the first mark detection step was normally completed (Yes), the controller 30 executes the second alignment process based on the detection result of step S405 (step S407). The controller 30 then judges whether or not the second alignment process was normally completed in step S407 (step S408), and if it is judged that the second alignment process was normally completed (Yes), the exposure process is executed (step S409), and the second treatment process terminates.

On the other hand, if it is judged that the first mark detection step was not normally completed in step S406 (No), the controller 30 moves to step S410. Next, the controller 30 causes the second detector 22 to detect the mark 31 existing on the wafer W in a low-power view (a second view or second magnification) in the second alignment unit as a second mark detection step of process 2A (step S410). Next, the controller 30 judges whether or not the second mark detection step was normally completed in step S410 (step S411). Now, if it is judged that the second mark detection step was normally completed (Yes), the controller 30 conducts the second alignment process of step S407 based on the detection result of step S411. Furthermore, if it is judged that normal completion did not occur in any of the judgment steps of step S403, S408, or S411 (No), the controller 30 stops the exposure apparatus 1 (step S412), compelling stoppage of the second treatment process.

In this manner, with respect to both the first treatment process and the second treatment process in a conventional exposure apparatus, the treatment sequence is forcibly stopped in the case where alignment is not normally conducted in the first alignment process or the second alignment process. With respect to the wafer W subjected to forcible stoppage, either the exposure apparatus 1 automatically ejects it to the exterior of the device, or the exposure apparatus is stopped, and an operator manually takes it out of the device. That is, with a conventional exposure apparatus, failure to normally complete the alignment process leads directly to a reduction in productivity. The present embodiment eliminates reductions in productivity by configuring the treatment process including the alignment process in the following manner.

Figure 2:
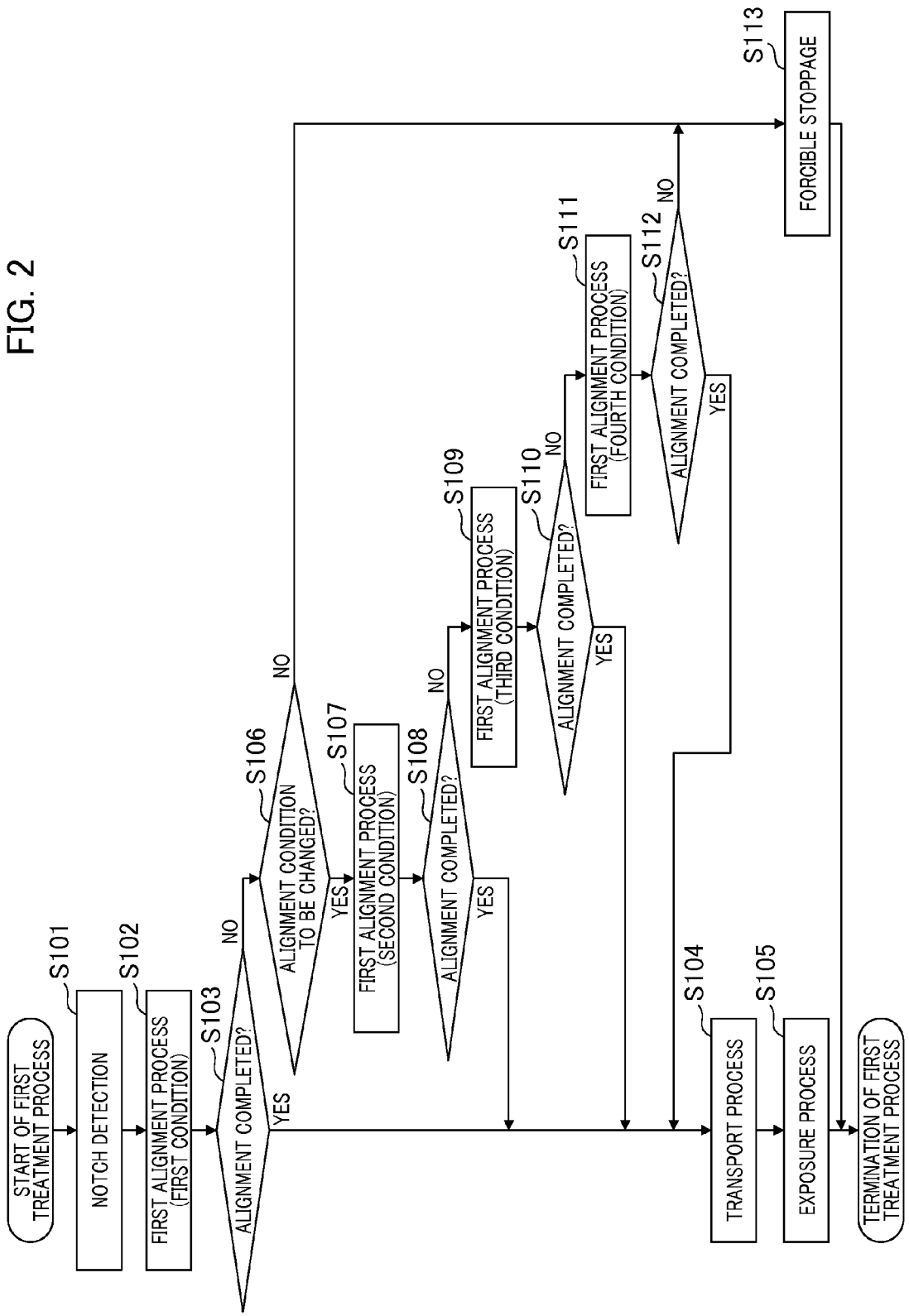
FIG. 2 is a flowchart which shows a first treatment process in the first embodiment.

Next, a description is given of the treatment process in the present embodiment. FIG. 2 is a flowchart which shows the first treatment process (first treatment sequence) in the present embodiment. As with the first treatment process in the above-described conventional exposure apparatus, the first treatment process referred to herein corresponds to a first exposure (first-time exposure or the like). As the respective steps of step S101 to S105 correspond to steps S301 to S305 in the conventional exposure apparatus shown in FIG. 4, a description thereof is omitted. Now, in the case where it is judged in step S103 that the first alignment process was not normally completed (No), the controller 30 judges whether or not specific conditions adopted in the first alignment process are to be changed (step S106). "Conditions" refer not only to alignment accuracy (detection accuracy), but also to detection conditions in the broad sense including the very principles of detection. With respect to whether or not to change conditions, the conditions are set in advance by an operator, and the controller 30 checks the setting contents in step S106.

First, in the case where it is judged in step S106 that conditions are to be changed (Yes), the first alignment process is executed with a second condition that differs from a condition (first condition) adopted in step S102 (step S107). Next, in the case where it is judged that the first alignment process was normally completed (Yes) when judging whether or not the first alignment process was normally completed in step S107 (step S108), the controller 30 moves to the transport process of S104. On the other hand, in the case where it is judged in step S107 that the first alignment process was not normally completed (No), the controller 30 moves to step S109. Next, the controller 30 executes the first alignment process under a third condition that differs from the first and second conditions, respectively (step S109). Next, the controller 30 judges in step S109 whether or not the first alignment process was normally completed (step S110), and moves to the transport process of step S104 in the case where the first alignment process was normally completed (Yes). On the other hand, in the case where it is judged in step S110 that the first alignment process was not normally completed (No), the controller 30 moves to step S111. Next, the controller 30 executes the first alignment process with a fourth condition that differs from the first to third conditions, respectively (step S111). Next, in the case where it is judged that the first alignment process was normally completed (Yes) when judging in step S111 whether or not the first alignment process was normally completed (step S112), the controller 30 moves to the transport process of step S104. On the other hand, in the case where it is judged in step S112 that the first alignment process was not normally completed (No), the controller 30 stops the exposure apparatus 1 (step S113), compelling stoppage of the first treatment process. Furthermore, in the case where it is judged that a specific condition adopted in the first alignment process is not to be changed (No) in the judging process of step S106, the controller 30 stops the exposure apparatus 1 (step S113), compelling stoppage of the first treatment process.

Specifically, the aforementioned first to fourth conditions may be set as follows. First, as the first condition, for example, one may adopt the same condition under which the first alignment process is conducted in a conventional exposure apparatus. In contrast, as the second condition, one may adopt a method wherein a measuring instrument that is not illustrated in the drawings measures the shape of foreign matter existing in a notch in the first alignment unit 100, and alignment is conducted that is adapted to the shape. Next, as the third condition, for example, one may adopt a method wherein alignment is conducted within a scope delimited by having alignment accuracy fall within the medium-power view of detection that enables conduct of the second alignment process. As the fourth condition, for example, one may adopt a method wherein alignment is conducted within a scope delimited by having alignment accuracy fall within the low-power view of detection that enables conduct of the second alignment process. With respect to these conditions, as the second alignment process is not conducted in the first treatment process, it is preferable to select a method that preserves accuracy as much as possible so as to facilitate detection of the mark 31 by the second alignment unit 200 in the subsequent second treatment process. Under the foregoing description, in the first treatment process, the first alignment process is conducted up to the fourth condition, but it is also acceptable to add a first alignment process that adopts another condition, or to eliminate a first alignment process of any of the conditions.

Figure 3:
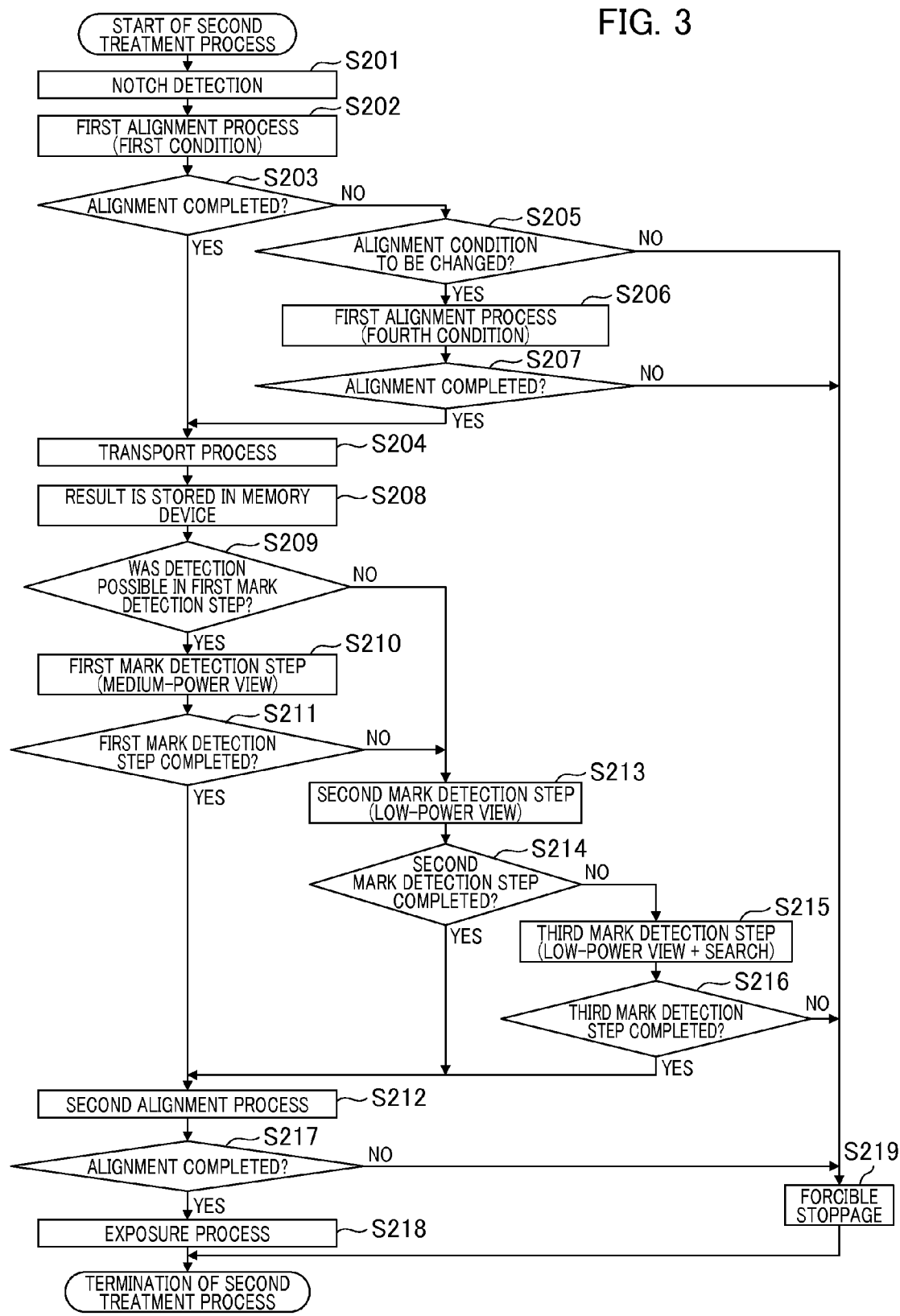
FIG. 3 is a flowchart which shows a second treatment process in the first embodiment.

FIG. 3 is a flowchart which shows the second treatment process (second treatment sequence) of the present embodiment. As with the second treatment process of the aforementioned conventional exposure apparatus, the second treatment process referred to herein corresponds to a second exposure (overlapping exposure or the like). As the respective steps of steps S201 to S203 correspond to steps S401 to S403 of the conventional exposure apparatus shown in FIG. 4, description thereof is omitted. Now, in the case where it is judged in step S203 that the first alignment process was normally completed (Yes), the controller 30 transports the wafer W to the wafer stage 21 by the second transport mechanism 60 in a transport process (step S204). On the other hand, in the case where it is judged in step S203 that the first alignment process was not normally completed (No), the controller 30 judges whether or not a specific condition adopted in the first alignment process is to be changed (step S205). In the case where the condition is to be changed (Yes), the controller 30 conducts the first alignment process under a fourth condition that differs from the condition (first condition) adopted in step S202 (step S206). In contrast to the first treatment process, under the second treatment process, there is only one change to the conditions of the first alignment process. Moreover, the condition that may be adopted under step S206 is the same condition as that of step S111 of the first treatment process shown in FIG. 2. This is because, under the second treatment process, it is not necessary to maintain the accuracy of the first alignment process in order to execute the second alignment process. Next, in the case where it is judged that the first alignment process was normally conducted (Yes) when judging whether or not the first alignment process was normally conducted in step S206, the controller 30 moves to the transport process of S204. On the other hand, in the case where it is judged in step S207 that the first alignment process was not normally conducted (No), the exposure apparatus 1 is stopped (step S218), compelling stoppage of the second treatment process. Furthermore, in the case where it is judged in the judging process of step S205 that a specific condition adopted by the first alignment process is not to be changed (No), the exposure apparatus 1 is stopped (step S218), compelling stoppage of the second treatment process.

After termination of the transport process of step S204, the controller 30 acquires the detection result of the first alignment process from the first controller 10 of the first alignment unit 100, and stores them in its internal memory (step S208).

Next, prior to the second detection process, the controller 30 references the detection result of the first alignment process acquired in step S208, and judges whether or not the detection result falls within the prescribed range (step S209). Now, "prescribed range" refers to a range in which it is judged that detection is normally completed in the narrowest view (highest magnification)—i.e., in this example, in the medium-power view—that enables detection of the mark 31 existing on the wafer W in the second detection process. In the case where the first alignment process is completed by detection under the first condition, the controller 30 then judges that detection of the mark 31 is possible in the medium-power view (Yes). As the first mark detection step of process 2A, the controller 30 causes the second detector 22 in the second alignment unit 200 to detect the mark 31 in the medium-power view (step S210). Next, the controller 30 judges whether or not the first mark detection step was normally completed in step S210 (step S211). Now, in the case where it is judged that the first mark detection step was normally completed (Yes), the controller 30 executes the second alignment process based on the detection result of step S210 (step S212).

On the other hand, in the case where the first alignment process is completed by detection under a condition (fourth condition) other than the first condition—i.e., in the case where the detection result does not fall within the aforementioned prescribed range—the controller 30 judges in step S209 that detection of the mark 31 in the medium-power view is impossible (No). In this case, the controller 30 subsequently causes the second detector 22 in the second alignment unit 200 to detect the mark 31 in a low-power view as the second mark detection step of process 2A (step S213). Next, the controller 30 judges whether or not the second mark detection step was normally completed in step S213 (S214). In the case where it is judged that the second mark detection step was normally completed (Yes), the controller 30 executes the second alignment process based on the detection result of step S213 (step S212). In the case where it is judged that the first mark detection process was not normally completed in step S211 (No), the controller 30 moves to step S213.

On the other hand, in the case where it is judged in step S214 that the second mark detection step was not normally completed (No), the controller 30 moves to step S212. Next, as a third mark detection step in process 2A, the controller 30 causes the second detector 22 to seek the mark 31 (change detection regions) in a low-power view while moving the wafer stage 21 in the second alignment unit 200 (S215). With respect to the circumstances under which the mark 31 is unable to be detected in the second mark detection step of step S213, it is often the case that the mark 31 slightly, rather than greatly, deviates from the low-power view. Thus, the controller 30 sets the search range at the periphery of the low-power view, and moves the wafer stage 21. The search range is determined from the detection results of the first alignment process in step S202 or S206. Next, the controller 30 judges whether or not the third mark detection step was normally completed in step S215 (step S216). Now, in the case where it is judged that the third mark detection step was normally completed (Yes), the controller 30 executes the second alignment process based on the detection result of step S215 (step S212).

On the other hand, in the case where it is judged in step S216 that the third mark detection step was not normally completed (No), the controller 30 stops the exposure apparatus 1 (step S219), compelling stoppage of the second treatment process. As the respective steps from S212 of the second alignment process to step S218 of the exposure process correspond to steps S407 to S409 of the conventional exposure apparatus shown in FIG. 4B, description thereof is omitted.

Under the foregoing description, in the second treatment process, the controller 30 changes only once the specific condition adopted under the first alignment process in the case where it is judged in step S203 that the first alignment process was not normally conducted. This is desirable in terms of reducing the total time pertaining to the first alignment process included in the second treatment process, but it is also acceptable to change the specific condition adopted in the first alignment process several times, as in the first treatment process. Under the foregoing description, in the second treatment process, change is conducted prior to the second alignment process up to the third mark detection step, but it is also acceptable to add another mark detection step, or to eliminate any of the mark detection steps. For example, in the case where the first mark detection step is not normally completed in step S207, a step including search for the mark 31 like the third mark detection step may also be included before moving to the second mark detection step of step S213. In this case, the controller 30 may have the second detector 22 search for the mark 31 in a medium-power view while moving the wafer stage 21 in the second alignment unit 200.

Thus, with the conventional exposure apparatus, in the case where alignment could not be conducted at a prescribed accuracy in the first alignment process due to the existence of foreign matter or the like, it was conceived that the device would be stopped, resulting in reduced productivity. In contrast, with the exposure apparatus 1, even in such a case, there is no immediate stoppage of the device, because conditions in the first alignment process are changed, and the alignment process is conducted again, enabling minimization of the reduction in productivity. Furthermore, with the exposure apparatus 1, when initiating the second alignment process, the alignment conditions in the second alignment process are determined based on the detection results obtained in the first alignment process, enabling reduction of total detection time in the second alignment process. Reduction of total detection time in the second alignment process also has the effect of contributing to productivity enhancement of the exposure apparatus 1.

As described above, according to the present embodiment, it is possible to provide an exposure apparatus that is advantageous in terms of productivity.

In the foregoing description, the controller 30 which integrates control of the entire exposure apparatus 1 controls (manages) the first alignment process and the second alignment process, and the first controller 10 and the second controller 20 respectively control the alignment units 100 and 200. However, the present invention is not limited thereto. For example, it is also acceptable to have the controller 30 only transmit a command to conduct alignment to the first controller 10 and the second controller 20, and have the first controller 10 and the second controller 20 perform all control involving the first alignment process and the second alignment process. For example, in step S208 of FIG. 3, the controller 30 acquires the detection result of the first alignment process from the first controller 10, and transmits it to the second controller 20. In contrast, in the case where the first controller 10 and the second controller 20 perform the series of alignment processes without intervention of the controller 30, it is acceptable to instead have a configuration where the first controller 10 directly transmits the detection result of the first alignment process to the second controller 20. In this case, in step S209 of FIG. 3, the second controller 20 references the detection result of the first alignment process before the second alignment process, and judges whether or not it is possible to detect the mark 31 existing on the wafer W in a medium-power view.

With respect to step S208 in FIG. 3, the timing at which the controller 30 acquires the detection result of the first alignment process from the first controller 10 may be in the interval after termination of the first alignment process until the start of the second alignment process. Accordingly, in the foregoing description, the controller 30 acquires the detection result of the first alignment process after termination of the transport process of step S204, but it is also acceptable to have it acquired simultaneous with the transport process, or before the transport process.

(Article Manufacturing Method)

An article manufacturing method according to an embodiment of the present invention is preferred in manufacturing an article such as a micro device such as a semiconductor device or the like, an element or the like having a microstructure, or the like. The article manufacturing method may include a step of forming a pattern (e.g., latent image pattern) on an object (e.g., substrate on which a photosensitive material is coated) using the aforementioned lithography apparatus; and a step of processing (e.g., step of developing) the object on which the latent image pattern has been formed in the previous step. Furthermore, the article manufacturing method may include other known steps (oxidizing, film forming, vapor depositing, doping, flattening, etching, resist peeling, dicing, bonding, packaging, and the like). The device manufacturing method of this embodiment has an advantage, as compared with a conventional device manufacturing method, in at least one of performance, quality, productivity and production cost of a device.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-103097 filed May 19, 2014, which is hereby incorporated by reference herein in its entirety.

What is claimed is:

1. An exposure apparatus configured to expose a pattern on a substrate, the apparatus comprising:
   a first detector configured to detect a shape of the substrate;
   a first alignment unit configured to conduct a first alignment of the substrate based on a detection result of the first detector;
   a second detector configured to detect a mark formed on the substrate that was aligned by the first alignment unit;
   a second alignment unit configured to conduct a second alignment of the substrate that was aligned by the first alignment unit based on a detection result of the second detector; and
   a controller,
   wherein, in a case where the first alignment of the substrate under a first condition cannot be conducted normally, the controller is configured to control the first alignment unit so that the first alignment of the substrate under a second condition is conducted,
   wherein the first alignment of the substrate under the first condition enables the second detector to detect the mark in a first view and the first alignment of the substrate under the second condition enables the second detector to detect the mark in a second view which is wider than the first view,
   wherein, in a case where the first alignment of the substrate was conducted under the first condition, the controller is configured to control the second alignment unit so that the second alignment of the substrate is conducted based on a detection result of the second detector which detects the mark in the first view,
   and wherein, in a case where the first alignment of the substrate was conducted under the second condition, the controller is configured to control the second alignment unit so that the second alignment of the substrate is conducted based on a detection result of the second detector which detects the mark in the second view.

2. The apparatus according to claim 1, wherein the controller is configured to control the first alignment unit so that the first alignment of the substrate under the second condition is conducted at a rougher alignment accuracy than the prescribed alignment accuracy, when the first alignment of the substrate under the first condition cannot be conducted by the first alignment unit at the prescribed alignment accuracy.

3. The apparatus according to claim 1, further comprising a substrate holder configured to hold the substrate, wherein the controller is configured to move the substrate holder so that the mark is within a detection region of the second detector, and control the second alignment unit so that the second alignment of the substrate is conducted.

4. The apparatus according to claim 1, further comprising a second substrate holder configured to hold the substrate, wherein foreign matter adheres to a notched portion provided in a peripheral region of the substrate, and the controller is configured to rotate the second substrate holder, and control the first alignment unit so that the first alignment of the substrate is conducted based on a detection result from detection of the notched portion by the first detector.

5. The apparatus according to claim 4, further comprising a conveyor configured to transport the substrate to the second alignment unit from the first alignment unit, wherein the prescribed alignment accuracy includes a transport accuracy of the conveyor.

6. An exposure apparatus configured to expose a pattern on a substrate, the apparatus comprising:
   a first detector configured to detect a shape of the substrate;
   a first alignment unit configured to conduct a first alignment of the substrate based on a detection result of the first detector;
   a second detector configured to detect a mark formed on the substrate that was aligned by the first alignment unit;
   a second alignment unit configured to conduct a second alignment of the substrate that was aligned by the first alignment unit based on a detection result of the second detector; and
   a controller,
   wherein, in a case where the first alignment of the substrate under a first condition cannot be conducted normally, the controller is configured to control the first alignment unit so that the first alignment of the substrate under a second condition is conducted,
   wherein the first alignment of the substrate under the first condition enables the second detector to detect the mark at a first magnification and the first alignment of the substrate under the second condition enables the second detector to detect the mark in a second magnification which is lower than the first magnification, wherein, in a case where the first alignment of the substrate was conducted under the first condition, the controller is configured to control the second alignment unit so that the second alignment of the substrate is conducted based on a detection result of the second detector which detects the mark at the first magnification, and wherein, in a case where the first alignment of the substrate was conducted under the second condition, the controller is configured to control the second alignment unit so that the second alignment of the substrate is conducted based on a detection result of the second detector which detects the mark at the second magnification.

7. A method of aligning a substrate with a predetermined position, the method comprising:
a first detection process which detects a shape of the substrate;
a first alignment process which conducts a first alignment of the substrate based on a detection result obtained in the first detection process;
a second detection process which detects a mark formed on the substrate that was aligned in the first alignment process;
and a second alignment process which conducts a second alignment of the substrate that was aligned in the first alignment process based on a detection result obtained in the second detection process,
wherein, in a case where the first alignment process under a first condition cannot be conducted normally, the first alignment process is conducted under a second condition,
wherein the first alignment process under the first condition enables the mark to be detected in a first view and the first alignment process under the second condition enables the mark to be detected in a second view which is wider than the first view, and
wherein, in the second detection process:
in a case where the first alignment process was conducted under the first condition, the mark is detected in the first view; and
in a case where the first alignment process was conducted under the second condition due to adherence of foreign matter to the substrate, the mark is detected in the second view.

8. A method of aligning a substrate with a predetermined position, the method comprising:
a first detection process which detects a shape of the substrate;
a first alignment process which conducts a first alignment of the substrate based on a detection result obtained in the first detection process;
a second detection process which detects a mark formed on the substrate that was aligned in the first alignment process;
and a second alignment process which a second conducts alignment of the substrate that was aligned in the first alignment process based on a detection result obtained in the second detection process,
wherein, in a case where the first alignment process under a first condition cannot be conducted normally, the first alignment process is conducted under a second condition,
wherein the first alignment process under the first condition enables the mark to be detected at a first magnification and the first alignment process under the second condition enables the mark to be detected at a second magnification which is lower than the first magnification, and
wherein, in the second detection process:
in a case where the first alignment process was conducted under the first condition, the mark is detected at the first magnification; and
in a case where the first alignment process was conducted under the second condition due to adherence of foreign matter to the substrate, the mark is detected at the second magnification.

9. A method for manufacturing an article, the method comprising:
exposing a pattern on a substrate using an exposure apparatus, and
developing the substrate to manufacture the article,
wherein the exposure apparatus includes:
a first detector configured to detect a shape of the substrate;
a first alignment unit configured to conduct a first alignment of the substrate based on a detection result of the first detector;
a second detector configured to detect a mark formed on the substrate that was aligned by the first alignment unit;
a second alignment unit configured to conduct a second alignment of the substrate that was aligned by the first alignment unit based on a detection result of the second detector; and
a controller,
wherein, in a case where the first alignment of the substrate under a first condition cannot be conducted normally, the controller is configured to control the first alignment unit so that the first alignment of the substrate under a second condition is conducted,
wherein the first alignment of the substrate under the first condition enables the second detector to detect the mark in a first view and the first alignment of the substrate under the second condition enables the second detector to detect the mark in a second view which is wider than the first view,
wherein, in a case where the first alignment of the substrate was conducted under the first condition, the controller is configured to control the second alignment unit so that the second alignment of the substrate is conducted based on a detection result of the second detector which detects the mark in the first view, and
wherein, in a case where the first alignment of the substrate was conducted under the second condition, the controller is configured to control the second alignment unit so that the second alignment of the substrate is conducted based on a detection result of the second detector which detects the mark in the second view.

* * * * *